United States Patent
Tsuda et al.

(10) Patent No.: US 9,201,998 B1
(45) Date of Patent: Dec. 1, 2015

(54) TOPOGRAPHY SIMULATION APPARATUS, TOPOGRAPHY SIMULATION METHOD AND RECORDING MEDIUM

(71) Applicant: KABUSHIKI KAISHA TOSHIBA, Minato-ku, Tokyo (JP)

(72) Inventors: Hirotaka Tsuda, Tokyo (JP); Masanori Takahashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/482,502

(22) Filed: Sep. 10, 2014

Related U.S. Application Data

(60) Provisional application No. 62/011,836, filed on Jun. 13, 2014.

(51) Int. Cl.
*G06F 17/50* (2006.01)

(52) U.S. Cl.
CPC .......... *G06F 17/505* (2013.01); *G06F 17/5081* (2013.01)

(58) Field of Classification Search
CPC ...................................... G06F 17/50
USPC ........................................ 716/136
See application file for complete search history.

(56) References Cited

U.S. PATENT DOCUMENTS 5,282,140 A * 1/1994 Tazawa et al. ................. 700/98
8,336,005 B2 12/2012 Taguchi et al.
2011/0082577 A1 4/2011 Kuboi et al.
2011/0307845 A1 12/2011 Taguchi et al.
2013/0325411 A1 12/2013 Ichikawa
2014/0005991 A1 1/2014 Ono et al.

FOREIGN PATENT DOCUMENTS

| | | |
|---|---|---|
| JP | 11-307459 | 11/1999 |
| JP | 2003-282549 | 10/2003 |
| JP | 2011-44656 | 3/2011 |
| JP | 2013-250662 | 12/2013 |

OTHER PUBLICATIONS

J. Yeom, et al., "Maximum Achievable Aspect Ratio in Deep Reactive Ion Etching of Silicon Due to Aspect Ratio Dependent Transport and the Microloading Effect", J. Vac. Sci. Technol., B 23(6), Nov./Dec. 2005, pp. 2319-2329.
J. O'Hanlon, "A User's Guide to Vacuum Technology", Third Edition, 2003, John Wiley & Sons, Inc., Hoboken, New Jersey, pp. vii-xviii and 25-56.

(Continued)

*Primary Examiner* — Thuan Do
(74) *Attorney, Agent, or Firm* — Finnegan, Henderson, Farabow, Garrett & Dunner, L.L.P.

(57) ABSTRACT

In one embodiment, a topography simulation apparatus includes a division module configured to divide topography of a substance of a semiconductor device into first to n-th layers, where n is an integer of two or more. The apparatus further includes a flux calculation module configured to calculate, for each of the first to n-th layers, a flux of particles which reach a surface of the substance in each layer. The apparatus further includes a topography calculation module configured to calculate, for each of the first to n-th layers, an amount of change of the topography of the substance in each layer based on the flux.

18 Claims, 12 Drawing Sheets

(56) References Cited

OTHER PUBLICATIONS

N. Matuda, et al., "Calculation of Molecular Conductance Based on the Stationary Solution of Diffusion Equation", J. Vac. Soc. Jpn.,vol. 53, No. 3, pp. 151-153, 2010.

K. O. Abrokwah, et al., "Pattern Based Prediction for Plasma Etch", IEEE Trans. Semicond. Manuf., vol. 20, No. 2, pp. 77-86, May 2007.

J. Kilhamaki, "Declaration of Silicon Etch Rate at High Aspect Ratios", J.Vac. Sci. Technol. A., vol. 18, No. 4, pp. 1385-1389, Jul. 2000.

Notification of Reasons for Rejection issued by the Korean Intellectual Property Office on Sep. 8, 2015, for Korean Patent Application No. 10-2014-0134315, and English-language translation thereof.

* cited by examiner

TOPOGRAPHY SIMULATION APPARATUS, TOPOGRAPHY SIMULATION METHOD AND RECORDING MEDIUM

CROSS REFERENCE TO RELATED APPLICATION

This application is based upon and claims the benefit of priority from the prior U.S. Provisional Patent Application No. 62/011,836 filed on Jun. 13, 2014, the entire contents of which are incorporated herein by reference.

FIELD

Embodiments described herein relate to a topography simulation apparatus, a topography simulation method and a recording medium.

BACKGROUND

In a topography simulation for a semiconductor device, it is required to calculate a flux of particles that reach a surface of a substance of the semiconductor device and contribute to the processing of topography of the substance in short time. The flux is called surface incident flux. For example, there is known a method of calculating the flux by using an aspect ratio of a concave portion formed in the substance. This method can calculate the flux in short time by approximating topography of the concave portion formed in the substance with one columnar shape, and analytically calculating the flux on a bottom surface of the concave portion.

DETAILED DESCRIPTION

Embodiments will now be explained with reference to the accompanying drawings.

In one embodiment, a topography simulation apparatus includes a division module configured to divide topography of a substance of a semiconductor device into first to n-th layers, where n is an integer of two or more. The apparatus further includes a flux calculation module configured to calculate, for each of the first to n-th layers, a flux of particles which reach a surface of the substance in each layer. The apparatus further includes a topography calculation module configured to calculate, for each of the first to n-th layers, an amount of change of the topography of the substance in each layer based on the flux.

First Embodiment

Figure 1:
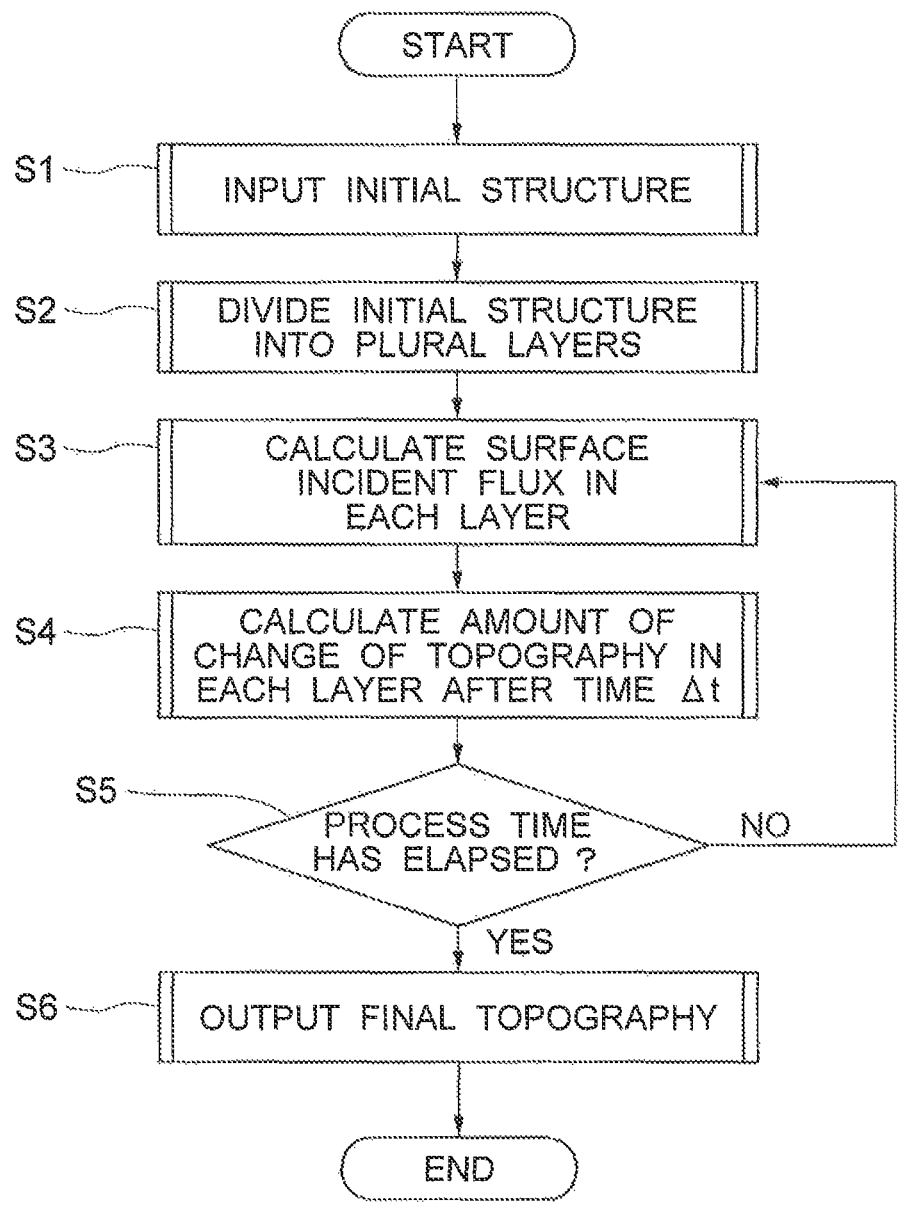
FIG. 1 is a flow chart showing a procedure of a topography simulation method of a first embodiment.

FIG. 1 is a flow chart showing a procedure of a topography simulation method of a first embodiment. The topography simulation method of the present embodiment is performed by using an information processing apparatus such as a personal computer and a workstation.

The topography simulation method of the present embodiment will be described below with reference to FIG. 1. In this description, FIGS. 2A to 3B will be also referred to as appropriate.

In the topography simulation method of the present embodiment, the initial structure of a substance of a semiconductor device is inputted into the information processing apparatus (step S1). Although examples of a method of inputting the initial structure include various possible formats, the present embodiment uses a method in which topography of a surface of the substance is represented in a point sequence, and the information processing apparatus reads this point sequence.

Figure 2A:
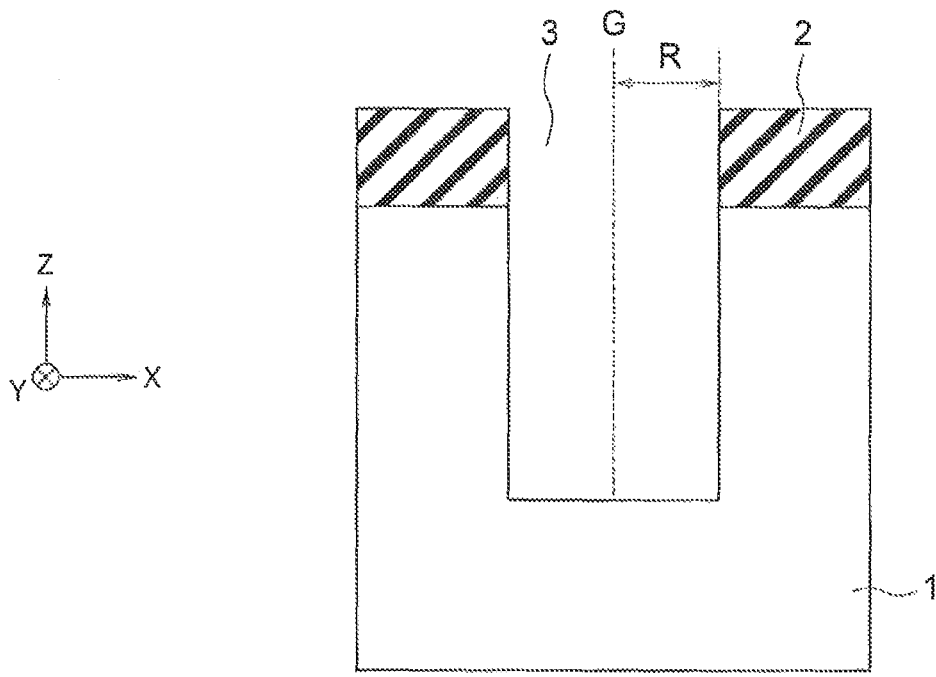
FIGS. 2A and 2B are cross sectional views showing an example of an initial structure of a substance in the first embodiment.

FIG. 2A is a cross sectional view showing an example of the initial structure of the substance in the first embodiment. The initial structure in FIG. 2A includes a substrate 1, a mask layer 2 formed on the substrate 1, and a concave portion 3 formed in the substrate 1 and the mask layer 2. Examples of the substrate 1 include a semiconductor substrate, and a workpiece substrate in which a workpiece layer is formed on a semiconductor substrate. Examples of the mask layer 2 include a hard mask layer and a resist mask layer. Topography of the concave portion 3 in FIG. 2A (initial topography) is a columnar shape. Reference character G denotes the central axis of the concave portion 3. Reference character R denotes the radius of the concave portion 3 (initial radius).

FIG. 2A shows an X direction and a Y direction that are parallel to a main surface of the substrate 1 and are perpendicular to each other, and a Z direction that is perpendicular to the main surface of the substrate 1. In the present specification, the +Z direction is treated as an upward direction, and the −Z direction is treated as a downward direction. For example, the positional relationship between the substrate 1 and the mask layer 2 is expressed that the substrate 1 is positioned below the mask layer 2.

The topography of the initial structure of the substance is divided into first to n-th layers $L_1$ to $L_n$, where n is an integer of two or more (step S2). A block in the information processing apparatus for performing a process of step S2 is an example of a division module of the present disclosure.

Figure 2B:
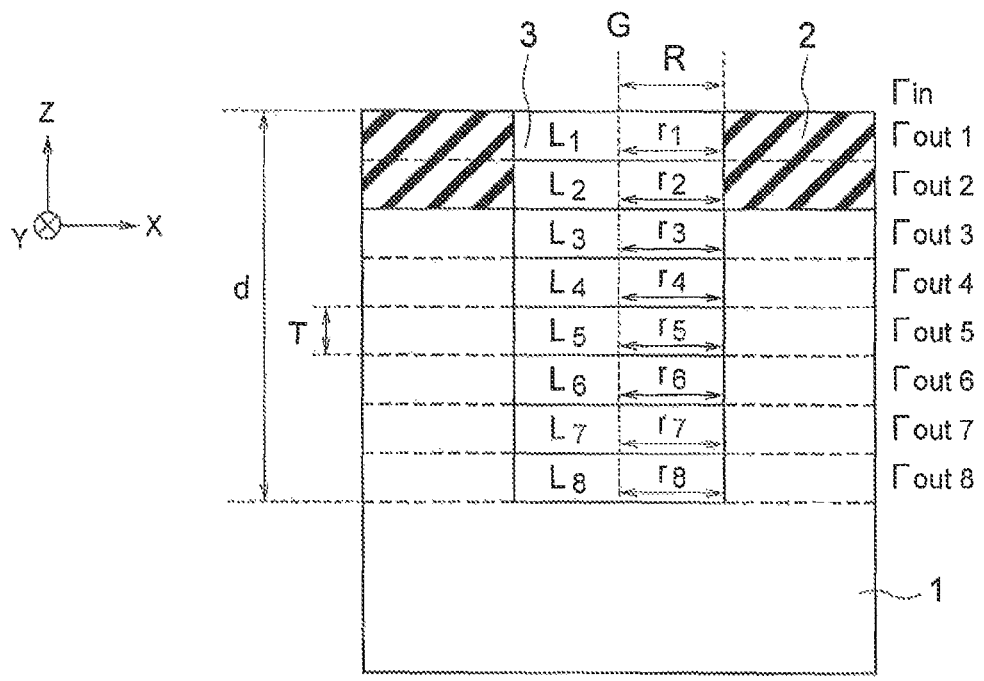

FIG. 2B is a cross sectional view showing, similarly to FIG. 2A, the example of the initial structure of the substance in the first embodiment. FIG. 2B shows the example in which the topography of the initial structure of the substance is divided into the first to eighth layers $L_1$ to $L_8$ having the same thickness T. Reference character d denotes the depth of the concave portion 3. Reference characters $r_1$ to $r_8$ denote radii $r_1$ to $r_8$ of the concave portion 3 in the first to eighth layers $L_1$ to $L_8$, respectively. All the values of the radii $r_1$ to $r_8$ in FIG. 2B are R. In the present embodiment, the start position of dividing the topography of the substance (the upper surface of the first layer $L_1$) is set at the aperture face of the concave portion 3, and the end position of dividing the topography of the substance (the lower surface of the eighth layer $L_8$) is set at the bottom surface of the concave portion 3.

Steps S3 to S6 of the topography simulation method in the present embodiment will be described below with reference to the initial structure in FIGS. 2A and 2B as an example. Therefore, the division number n of the topography of the substance is set at eight.

Step 3 is performed to calculate, for each of the first to eighth layers $L_1$ to $L_8$, a flux of particles that reach the surface of the substance in each layer. The flux is called surface incident flux. In the initial structure in FIGS. 2A and 2B, step 3 is performed to calculate the flux of the particles that reach the side surface of the concave portion 3 in each layer. A block in the information processing apparatus for processing a process of step S3 is an example of a flux calculation module of the present disclosure.

Reference character $\Gamma_{in}$ denotes the flux of the particles that reach the upper surface of a region of the concave portion 3 in the first layer $L_1$. Reference characters $\Gamma_{out\_1}$ to $\Gamma_{out\_8}$ denote the fluxes of the particles that reach the lower surfaces and the side surfaces of regions of the concave portion 3 in the first to eighth layers $L_1$ to $L_8$, respectively. Therefore, the fluxes $\Gamma_{out\_1}$ to $\Gamma_{out\_8}$ correspond to the surface incident fluxes in the first to eighth layers $L_1$ to $L_8$, respectively. A method of calculating the surface incident fluxes $\Gamma_{out\_1}$ to $\Gamma_{out\_8}$ will be described later.

The particles treated in step S3 in the present embodiment are particles that contribute to the processing of the topography of the substance. Examples of such particles include ions or radicals that contribute to deposition, oxidation, nitriding, epitaxial growth, etching, ashing or the like.

Step 4 is performed to calculate, for each of the first to eighth layers $L_1$ to $L_8$, an amount of change of the topography of the substance in each layer based on the surface incident fluxes $\Gamma_{out\_1}$ to $\Gamma_{out\_8}$. Specifically, step 4 is performed to calculate the amounts of change $\Delta r_1$ to $\Delta r_8$ of the radii $r_1$ to $r_8$ of the concave portion 3 in the respective layers after the lapse of a time $\Delta t$ from an initial time $t_0$. A block in the information processing apparatus for processing a process of step S4 is an example of a topography calculation module of the present disclosure.

In step S4 of the present embodiment, it is assumed that topography of a region of the concave portion 3 in each layer changes isotropically in a radial direction of a columnar shape, and the columnar shape changes into another columnar shape. In other words, it is assumed that the radius of the concave portion 3 in each layer changes in step S4 of the present embodiment. The amount of change $\Delta r_m$ of the radius $r_m$ of the concave portion 3 in an arbitrary m-th layer among the first to eighth layers $L_1$ to $L_8$ is provided by the following expression (1):

$$\Delta r_m = \frac{\Gamma_{out\_m}}{\Gamma_{in}} R_p \Delta t \qquad (1)$$

where m is an integer from one to eight, and reference character $R_p$ denotes the processing rate of the substance. In the present embodiment, since the flux $\Gamma_{in}$ is set at one, the expression (1) is replaced with the following expression (2).

$$\Delta r_m = \Gamma_{out\_m} R_p \Delta t \qquad (2)$$

Figure 3A:
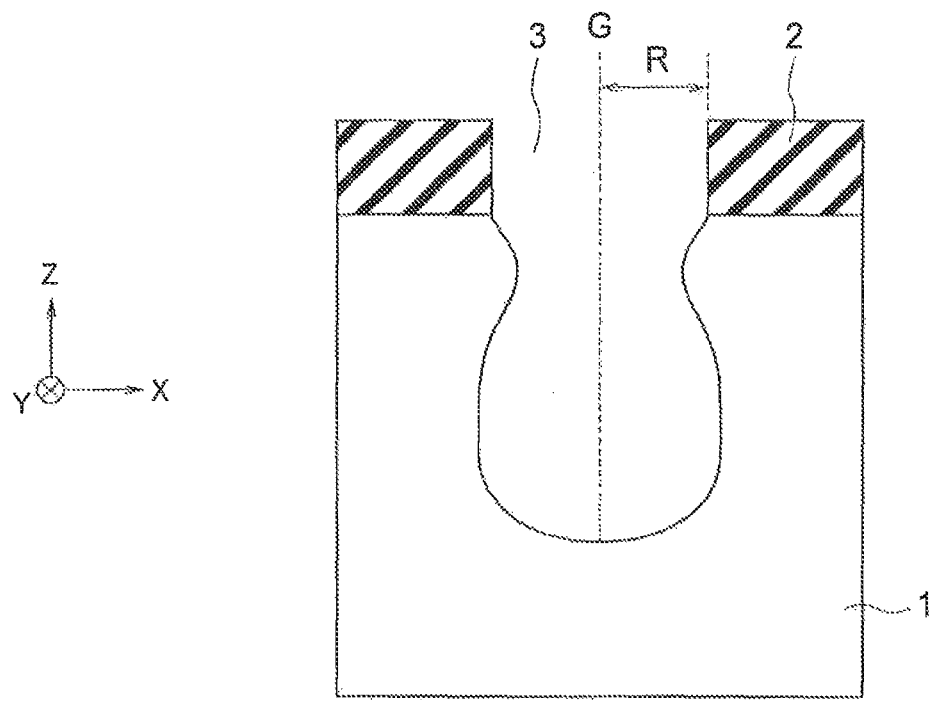
FIGS. 3A and 3B are cross sectional views showing an example of a topography change of the substance in the first embodiment.
Figure 3B:
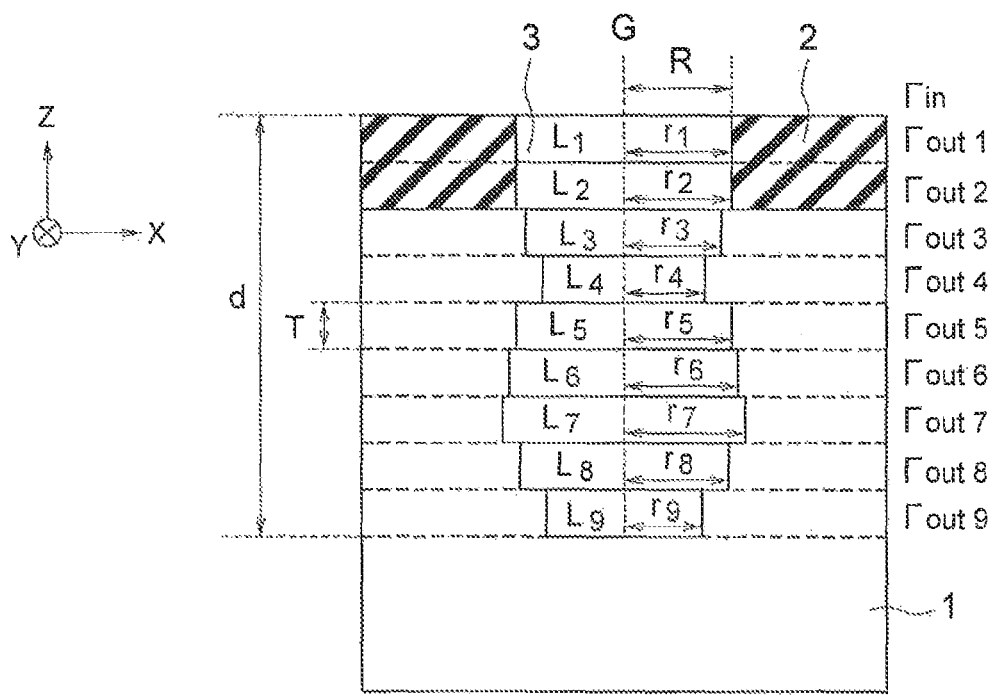

In the present embodiment, the processes of the step S3 and step S4 are repeated until a preset process time elapses (step S5). Thereby, the topography of the substance changes as shown in FIGS. 3A and 3B. FIGS. 3A and 3B are cross sectional views showing an example of a topography change of the substance in the first embodiment.

FIG. 3B shows the topography of the region of the concave portion 3 in each layer after the time t elapses from the initial time $t_0$ (=0). FIG. 3B shows a state in which the topography of the region of the concave portion 3 in each layer has changed with maintaining the columnar shape. It is noted that since the values of the radii $r_1$ to $r_8$ have differently changed, the topography of the entire concave portion 3 in FIG. 3B has changed into a shape different from the columnar shape.

In this way, the present embodiment makes it possible to simulate a process that the concave portion 3 having the columnar shape changes into a shape different from the columnar shape. For example, the present embodiment makes it possible to simulate a process that the initial topography in FIG. 2A changes into the topography in FIG. 3A.

FIG. 3B shows a state in which the concave portion 3 expands to a new ninth layer $L_9$. In the present embodiment, it is also possible to simulate the change in depth d of the concave portion 3 by applying the expression (2) to the bottom surface of the concave portion 3. In this way, the present embodiment may vary the division number n of the topography of the substance with the change of the topography of the substance with the lapse of the time t. Such a process will be described later in detail in a second embodiment.

When the process time has elapsed, the final topography of the substance is outputted (step S6), and the calculation is finished.

(1) Method of Calculating Surface Incident Fluxes $\Gamma_{out\_1}$ to $\Gamma_{out\_8}$ In the present embodiment, the surface incident fluxes $\Gamma_{out\_1}$ to $\Gamma_{out\_8}$ are calculated by using an aspect ratio of the region of the concave portion 3 in each layer. The method of calculating the surface incident fluxes $\Gamma_{out\_1}$ to $\Gamma_{out\_8}$ of the present embodiment will be described below with reference to FIGS. 4 to 6C.

Figure 4:
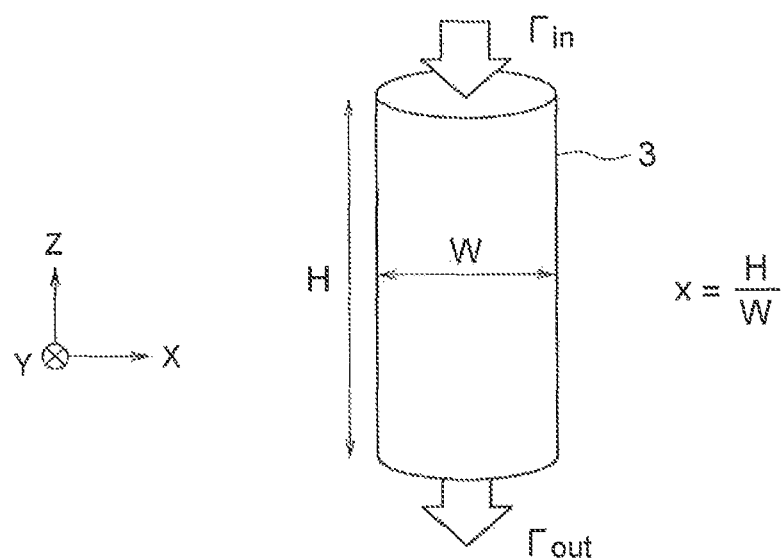
FIG. 4 is a perspective view for illustrating an aspect ratio x.

FIG. 4 is a perspective view for illustrating an aspect ratio x.

FIG. 4 shows an example of the concave portion 3 having a columnar shape. Reference characters $\Gamma_{in}$ and $\Gamma_{out}$ denote the fluxes of the particles that reach the upper surface and the lower surface of the concave portion 3, respectively. Reference character H denotes the height of the concave portion 3. Reference character W denotes the aperture width (diameter) of the concave portion 3. Reference character x denotes the aspect ratio of the concave portion 3. The aspect ratio x of the concave portion 3 is given by the expression of x=H/W.

Figure 5:
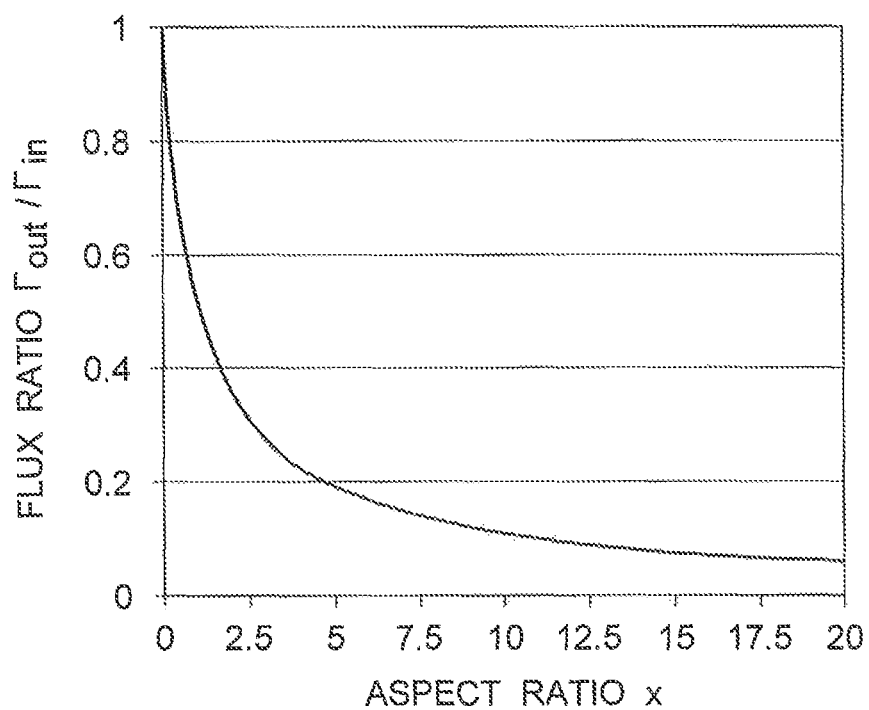
FIG. 5 is a graph showing an example of a relationship between the aspect ratio x and a flux ratio $\Gamma_{out}/\Gamma_{in}$ in FIG. 4.

FIG. 5 is a graph showing an example of a relationship between the aspect ratio x and a flux ratio $\Gamma_{out}/\Gamma_{in}$ in FIG. 4. In the present embodiment, since the flux $\Gamma_{in}$ is set at one, the flux ratio $\Gamma_{out}/\Gamma_{in}$ is the same value as that of the flux $\Gamma_{out}$.

FIG. 5 shows the relationship between the aspect ratio x and the flux ratio $\Gamma_{out}/\Gamma_{in}$ in the case where the flow of the particles in the concave portion 3 is represented by Knudsen transport model. Knudsen transport model represents the flow of the particles in a case where a mean free path of the particles is sufficiently longer than the aperture width W (molecular flow). In this case, the flow of the particles is not much influenced by the collision between the particles, but is influenced by the collision between the particles and the inner surface of the concave portion 3.

The relationship between the aspect ratio x and the flux ratio $\Gamma_{out}/\Gamma_{in}$ in Knudsen transport model is given by the following expression (3).

$$\frac{\Gamma_{out}}{\Gamma_{in}} = K(x) = \left(1 + \frac{3}{4}x\right)^{-1} \quad (3)$$

K(x) in the expression (3) is called Clausing factor representing a transmission probability that the particles pass from the upper surface to the lower surface of the concave portion 3.

In the present embodiment, the surface incident fluxes $\Gamma_{out\_1}$ to $\Gamma_{out\_8}$ are calculated assuming that the flow of the particles in each of the first to eighth layers $L_1$ to $L_8$ is represented by Knudsen transport model of the expression (3).

Figure 6A:
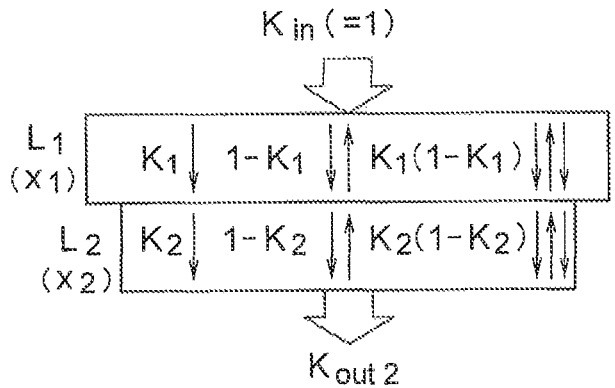
FIGS. 6A to 6C are cross sectional views for illustrating a method of calculating surface incident fluxes $\Gamma_{out\_1}$ to $\Gamma_{out\_8}$ of the first embodiment.
Figure 6B:
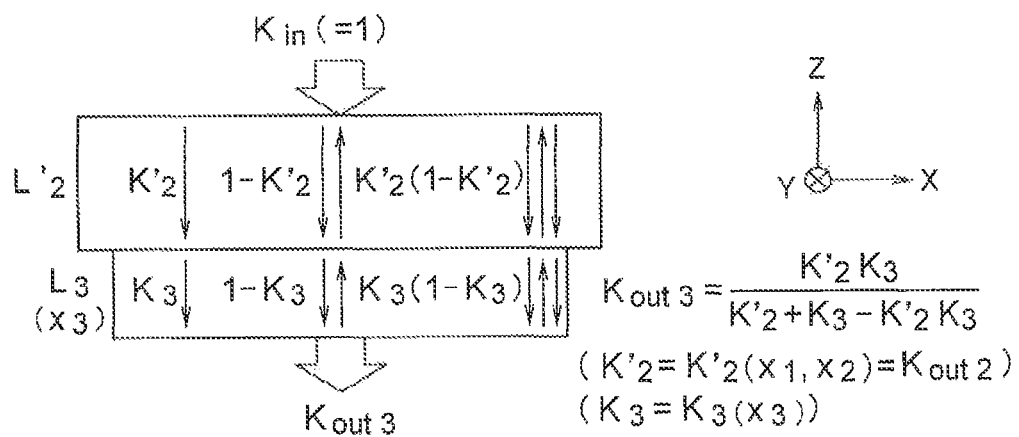
Figure 6C:
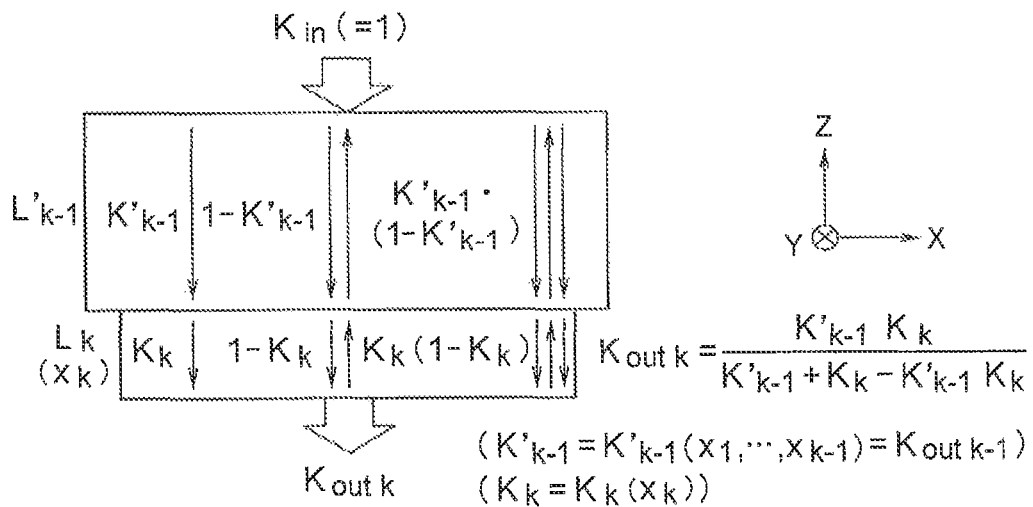

FIGS. 6A to 6C are cross sectional views for illustrating a method of calculating the surface incident fluxes $\Gamma_{out\_1}$ to $\Gamma_{out\_8}$ of the first embodiment.

FIG. 6A shows a method of calculating the surface incident flux $\Gamma_{out\_2}$ of the second layer $L_2$. Reference characters $x_1$ and $x_2$ denote the aspect ratios of the regions of the concave portion 3 in the first and second layers $L_1$ and $L_2$, respectively. The aspect ratios $x_1$ and $x_2$ are given by $T/2r_1$ and $T/2r_2$, respectively. Reference character T represents the thickness of each layer shown in FIGS. 2A to 3B.

Reference character $K_1$ denotes the transmission probability that the particles pass from the upper surface to the lower surface of the region of the concave portion 3 in the first layer $L_1$. Reference character $K_2$ denotes the transmission probability that the particles pass from the upper surface to the lower surface of the region of the concave portion 3 in the second layer $L_2$. The transmission probabilities $K_1$ and $K_2$ are respectively given by the following expressions (4) and (5) by using the expression (3).

$$K_1(x_1) = \left(1 + \frac{3}{4}x_1\right)^{-1} \quad (4)$$

$$K_2(x_2) = \left(1 + \frac{3}{4}x_2\right)^{-1} \quad (5)$$

As seen from the above, the transmission probabilities $K_1$ and $K_2$ are functions of the aspect ratios $x_1$ and $x_2$, respectively.

Reference character $K_{out\_2}$ denotes the transmission probability that the particles pass through the regions of the concave portion 3 in the first and second layers $L_1$ and $L_2$. The transmission probability $K_{out\_2}$ is given by the following expression (6) of the sum of an infinite series, taking the incidence and reflection of the particles in each layer into consideration as shown in FIG. 6A.

$K_1K_2$ $K_1K_2 + K_1K_2(1-K_1)(1-K_2)$ $K_1K_2 + K_1K_2(1-K_1)^2(1-K_2)^2$

...

$K_1K_2 + K_1K_2(1-K_1)^p(1-K_2)^p$ \quad (6)

By calculating the sum of the infinite series of the expression (6), the transmission probability $K_{out\_2}$ is given by the following expression (7).

$$K_{out\_2} = \frac{K_1 K_2}{K_1 + K_2 - K_1 K_2} \quad (7)$$

Therefore, the surface incident flux $\Gamma_{out\_2}$ in the second layer $L_2$ is given by the following expression (8) obtained by substituting the expression (7) into the expression (3).

$$\frac{\Gamma_{out\_2}}{\Gamma_{in}} = K_{out\_2} = \frac{K_1 K_2}{K_1 + K_2 - K_1 K_2} \quad (8)$$

It is noted that the transmission probability $K_{out\_1}$ that the particles pass through the region of the concave portion 3 in the first layer $L_1$ is the same value as that of the transmission probability $K_1$ ($K_{out\_1}=K_1$). Therefore, the surface incident flux $\Gamma_{out\_2}$ of the first layer $L_1$ is given by the expression (9) obtained by substituting $K_{out\_1}=K_1$ into the expression (3).

$$\frac{\Gamma_{out\_1}}{\Gamma_{in}} = K_{out\_1} = K_1 \quad (9)$$

FIG. 6B shows a method of calculating the surface incident flux $\Gamma_{out\_3}$ in the third layer $L_3$. Reference character $x_3$ denotes the aspect ratio of the region of the concave portion 3 in the third layer $L_3$. Reference character $K_3$ denotes the transmission probability that the particles pass from the upper surface to the lower surface of the region of the concave portion 3 in the third layer $L_3$. The transmission probability $K_3$ is given by the following expression (10) by using the expression (3).

$$K_3(x_3) = \left(1 + \frac{3}{4}x_3\right)^{-1} \quad (10)$$

As seen from the above, the transmission probability $K_3$ is a function of the aspect ratio $x_3$.

Reference character $K_{out\_3}$ denotes the transmission probability that the particles pass through the regions of the concave portion 3 in the first to third layers $L_1$ to $L_3$. When the transmission probability $K_{out\_3}$ is calculated, the first and second layers $L_1$ and $L_2$ are considered to be one layer $L_2'$ having the transmission probability $K_{out\_2}$. Therefore, the transmission probability $K_{out\_3}$ is given by the following expression (11) as with the expression (7).

$$K_{out\_3} = \frac{K_{out\_2} K_3}{K_{out\_2} + K_3 - K_{out\_2} K_3} \quad (11)$$

Therefore, the surface incident flux $\Gamma_{out\_3}$ of the third layer $L_3$ is given by the expression (12) obtained by substituting the expression (11) into the expression (3).

$$\frac{\Gamma_{out\_3}}{\Gamma_{in}} = K_{out\_3} = \frac{K_{out\_2} K_3}{K_{out\_2} + K_3 - K_{out\_2} K_3} \quad (12)$$

FIG. 6C shows a method of calculating a surface incident flux $\Gamma_{out\_k}$ in a k-th layer $L_k$ where k is an integer from two to n (=8). Reference character $x_k$ denotes the aspect ratio of the region of the concave portion 3 in the k-th layer $L_k$. Reference character $K_k$ denotes the transmission probability that the particles pass from the upper surface to the lower surface of the region of the concave portion 3 in the k-th layer $L_k$. The transmission probability $K_k$ is given by the following expression (13) by using the expression (3).

$$K_k(x_k) = \left(1 + \frac{3}{4} x_k\right)^{-1} \quad (13)$$

As seen from the above, the transmission probability $K_k$ is a function of the aspect ratio $x_k$. The aspect ratio $x_k$ is an example of a topography parameter representing the topography of the substance in the k-th layer.

Reference character $K_{out\_k}$ denotes the transmission probability that the particles pass through the regions of the concave portion 3 in the first to k-th layers $L_1$ to $L_k$. When the transmission probability $K_{out\_k}$ is calculated, the first to (k−1)-th layers $L_1$ to $L_{k-1}$ are considered to be one layer $L_{k-1}'$ having the transmission probability $K_{out\_k-1}$. Therefore, the transmission probability $K_{out\_k}$ is given by the following expression (14) as with the expression (7).

$$K_{out\_k} = \frac{K_{out\_k-1} K_k}{K_{out\_k-1} + K_k - K_{out\_k-1} K_k} \quad (14)$$

Therefore, the surface incident flux $\Gamma_{out\_k}$ in the k-th layer $L_k$ is given by the following expression (15) obtained by substituting the expression (14) into the expression (3).

$$\frac{\Gamma_{out\_k}}{\Gamma_{in}} = K_{out\_k} = \frac{K_{out\_k-1} K_k}{K_{out\_k-1} + K_k - K_{out\_k-1} K_k} \quad (15)$$

In this way, the surface incident flux $\Gamma_{out\_k}$ in the k-th layer $L_k$ of the present embodiment is calculated based on the surface incident flux $\Gamma_{out\_k-1}$ (=$K_{out\_k-1}$) in the (k−1)-th layer $L_{k-1}$ adjacent to the k-th layer $L_k$, and the transmission probability $K_k$ in the k-th layer $L_k$.

The surface incident fluxes $\Gamma_{out\_1}$ to $\Gamma_{out\_8}$ calculated in this way are respectively used for calculating the amounts of change $\Delta r_1$ to $\Delta r_8$ in the radii $r_1$ to $r_8$ in step S4.

It is noted that the values of the transmission probabilities $K_1$ to $K_8$ and the surface incident fluxes $\Gamma_{out\_1}$ to $\Gamma_{out\_8}$ change with the lapse of the time t. The reason for this is that since the radii $r_1$ to $r_8$ change with the lapse of the time t, the aspect ratios $x_1$ to $x_8$ also change with the lapse of the time t.

(2) Details of Method of Calculating Surface Incident Fluxes $\Gamma_{out\_1}$ to $\Gamma_{out\_8}$ The method of calculating the surface incident fluxes $\Gamma_{out\_1}$ to $\Gamma_{out\_8}$ of the present embodiment will be described in detail with reference to the same FIGS. 6A to 6C.

As described above, the present embodiment calculates the surface incident fluxes $\Gamma_{out\_1}$ to $\Gamma_{out\_8}$ using Knudsen transport model. Knudsen transport model well fits the behavior of the particles moving isotropically like radicals. Furthermore, Knudsen transport model well fits the behavior of the particles moving in a low-pressure atmosphere close to vacuum. Therefore, the method of calculating the surface incident fluxes $\Gamma_{out\_1}$ to $\Gamma_{out\_8}$ of the present embodiment is suitable for, for example, simulating a plasma process in manufacturing a semiconductor device. An example where the present embodiment is applied to the particles moving anisotropically like ions will be described later.

The present embodiment can analytically calculate the surface incident fluxes $\Gamma_{out\_1}$ to $\Gamma_{out\_8}$ by using Knudsen transport model as shown by the expression (15) for example. However, the present embodiment may use a model other than Knudsen transport model. In this case, the surface incident fluxes $\Gamma_{out\_1}$ to $\Gamma_{out\_8}$ may be given by a form other than analytical formula, for example, by a form of an empirical formula obtained by experimentation.

In the present embodiment, the initial topography of the concave portion 3 is set to have a columnar shape, However, the initial topography of the concave portion 3 of the present embodiment may be set to have a shape other than the columnar shape. Examples of such an initial topography of the concave portion 3 include a prism shape having a quadrilateral or another polygonal cross section, and a cylindrical shape having an annular cross section.

In the present embodiment, the change of the topography of the region of the concave portion 3 in each layer is calculated such that it changes from a columnar shape into another columnar shape. However, the present embodiment is applicable to other topography changes by introducing amounts of change of the topography other than the amounts of change $\Delta r_1$ to $\Delta r_8$ of the radii $r_1$ to $r_8$, and topography parameters other than the aspect ratios $x_1$ to $x_8$. Examples of such amounts of change of the topography include an amount of change of the length of an edge of the concave portion 3 having a prism shape. In addition, examples of such topography parameters include a ratio of the length of the edge of the concave portion 3 to the height (thickness) of the concave portion 3.

In the present embodiment, the thicknesses of the first to eighth layers $L_1$ to $L_8$ are set at the same thickness T. However, the thicknesses of the first to eighth layers $L_1$ to $L_8$ of the present embodiment may be set to be different from one another. An example will be described later in which the thicknesses of these layers are set to be different from one another.

In the present embodiment, the radii $r_1$ to $r_8$ of the initial topography of the concave portion 3 in the first to eighth layers $L_1$ to $L_8$ are set at the same value. However, the radii $r_1$ to $r_8$ of the initial topography of the concave portion 3 of the present embodiment may be set to be different from one another. In other words, in the initial topography of the concave portion 3 in the present embodiment, the cross sectional shapes of the concave portion 3 in the first to eighth layers $L_1$ to $L_8$ may be set to be different from one another.

(3) Modification of First Embodiment

Figure 7:
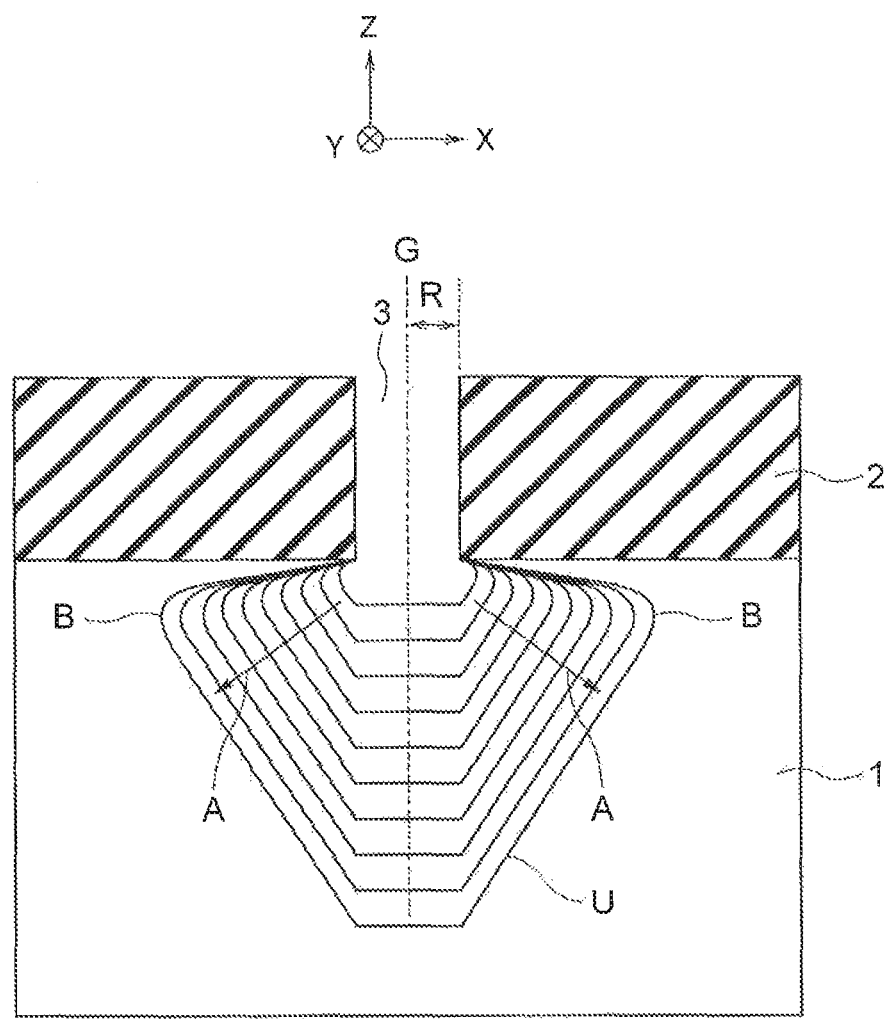
FIG. 7 is a cross sectional view showing another example of the topography change of the substance in the first embodiment.

FIG. 7 is a cross sectional view showing another example of the topography change of the substance in the first embodiment.

Reference character U denotes the surface of the concave portion 3 at the time t. Arrows A denote directions in which the surface U of the concave portion 3 changes with the lapse of the time t. Reference character B denotes an end portion of the surface U of the concave portion 3.

The present embodiment can simulate a process that the side surface of the concave portion 3 is etched in a horizontal direction by calculating the amounts of change $\Delta r_1$ to $\Delta r_8$ of the radii $r_1$ to $r_8$. For example, in a dry etching by using fluorine-containing etching gas, it is known that the substrate 1 is etched isotropically both in the depth direction and the horizontal direction. As shown in FIG. 7, the present embodiment makes it possible to simulate such dry etching. FIG. 7 shows the result of simulating an undercut process that the substrate 1 below the mask layer 2 is etched by using the mask layer 2 which has a processing rate lower than that of the substrate 1.

As described above, the topography simulation method of the present embodiment divides the topography of the substance into the first to n-th layers $L_1$ to $L_n$, calculates the surface incident fluxes $\Gamma_{out\_1}$ to $\Gamma_{out\_n}$ for the respective layers, and calculates the amounts of change $\Delta r_1$ to $\Delta r_n$ of the radii $r_1$ to $r_n$ of the concave portion 3 for the respective layers.

Therefore, the present embodiment makes it possible to handle the topography change of the side surface of the concave portion 3, for example, in the case where the topography of the concave portion 3 changes from the columnar shape into a shape other than the columnar shape. In other words, the present embodiment makes it possible to handle the topography change of the substance that is to be processed into various shapes.

Furthermore, the present embodiment makes it possible to calculate the surface incident fluxes $\Gamma_{out\_1}$ to $\Gamma_{out\_n}$ in short time, because the surface incident flux in each layer is calculated by using the aspect ratio of each layer. In other words, the present embodiment makes it possible to handle various topography changes of the substance, while shortening the calculating time of the surface incident fluxes $\Gamma_{out\_1}$ to $\Gamma_{out\_n}$. This is also applied to the case where a topography parameter other than the aspect ratio is used.

In the present embodiment, it is assumed that the flux on the side surface of the region of the concave portion 3 in each layer is the same as the flux ($\Gamma_{out\_1}$ to $\Gamma_{out\_n}$) on the bottom surface of the region of the concave portion 3 in each layer. Therefore, each of the fluxes $\Gamma_{out\_1}$ to $\Gamma_{out\_n}$ in the present embodiment is used as the surface incident flux on the side surface of the region of the concave portion 3 in each layer. The precision of such an approximation is considered to become finer by setting the division number n of the topography of the substance to be sufficiently large and making the thickness T of the layers sufficiently small. However, the division number n and the thickness T in the present embodiment can be arbitrarily set in accordance with the precision required for individual topography simulations.

Second Embodiment

Figure 8:
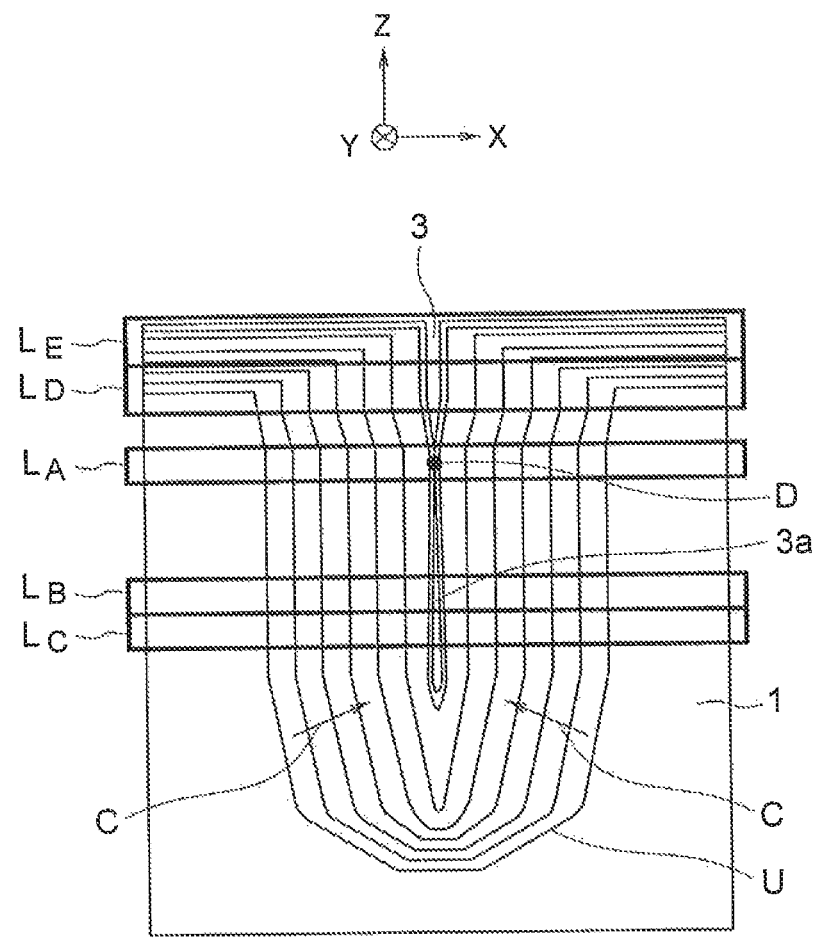
FIG. 8 is a cross sectional view for illustrating a topography simulation method of a second embodiment.

FIG. 8 is a cross sectional view for illustrating a topography simulation method of a second embodiment.

Reference character U denotes the surface of the concave portion 3 in the initial structure of the substance. Arrows C denote directions in which the surface U of the concave portion 3 changes with the lapse of a time t. Reference character D denotes a point of closure of the concave portion 3. FIG. 8 shows a state that the concave portion 3 is closed by embedding an insulating material in the concave portion 3 while a void 3a is left. FIG. 8 further shows a process that the insulating material is deposited on the substrate 1 outside the concave portion 3. Examples of the concave portion 3 include an isolation trench.

FIG. 8 illustrates five layers $L_A$ to $L_E$. The layer $L_A$ is positioned at a height where the layer $L_A$ includes the point of closure D. The layers $L_B$ and $L_C$ are positioned below the layer $L_A$. The layers $L_D$ and $L_E$ are positioned above the layer $L_A$. The layer $L_D$ is positioned at a height where the layer $L_D$ includes the main surface of the substrate 1, and the layer $L_E$ is positioned above the main surface of the substrate 1.

In the present embodiment, when the concave portion 3 is closed at the point of closure D, it is useless to perform the processes of steps S3 and S4 in FIG. 1 to the layers $L_B$ and $L_C$. Therefore, if the concave portion 3 is closed at the point of closure D at the time t, a process of removing the layers $L_B$ and $L_C$ below the layer $L_A$ is performed between steps S3 and S4 at the time t and steps S3 and S4 at the time t+$\Delta$t.

In the present embodiment, if the insulating material is deposited on the substrate 1 outside the concave portion 3, it is desirable that the layers $L_D$ and $L_E$ including this insulating material are added. Therefore, when the insulating material is deposited on the substrate 1 outside the concave portion 3 at the time t, a process of adding the layer $L_D$ (as well as the layer $L_E$ if needed) between steps S3 and S4 at the time t and steps S3 and S4 at the time t+$\Delta$t.

The timing to add the layers $L_D$ and $L_E$ may be arbitrarily set. For example, the layer $L_E$ may be added at the time when the surface of the insulating material reaches the inside of the layer $L_E$, or may be added at the time when the surface of the insulating material reaches the middle point between the upper surface and the lower surface of the layer $L_E$. This is also applied to the timing to add the above-described ninth layer $L_9$ (FIG. 3B).

As described above, the topography simulation method of the present embodiment varies the division number n of the topography of the substance with the change of the topography of the substance with the lapse of the time t. Therefore, the present embodiment makes it possible to realize a faster and more precise topography simulation by deleting a useless layer and adding a required layer.

Third Embodiment

Figure 9:
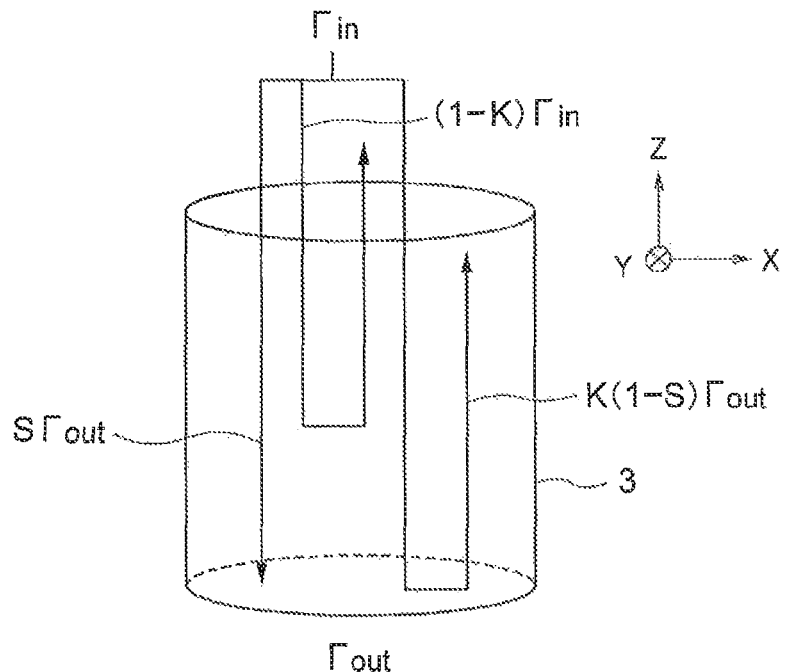
FIG. 9 is a perspective view for illustrating a topography simulation method of a third embodiment.

FIG. 9 is a perspective view for illustrating a topography simulation method of a third embodiment.

FIG. 9 shows an example of the concave portion 3 having a columnar shape, similarly to FIG. 4. Reference characters $\Gamma_{in}$ and $\Gamma_{out}$ denote the fluxes of the particles that reach the upper surface and the lower surface of the concave portion 3, respectively. Reference character K is the Clausing factor, which denotes the transmission probability that the particles pass from the upper surface to the lower surface of the concave portion 3. Reference character S denotes a reaction probability that the particle react with the substance inside the concave portion 3 or outside the concave portion 3. The reaction probability S is also called sticking probability.

FIG. 9 shows the flow of the particles in a case where the flow of the particles in the concave portion 3 is represented by Coburn reactive transport model. Coburn reactive transport model is a compensation model in which the reaction probability S is introduced into Knudsen transport model. Knudsen transport model is equivalent to Coburn reactive transport model in which the reaction probability S is one.

FIG. 9 shows a flux $S\Gamma_{out}$ that reacts with the substance after passing through the concave portion 3, a flux $(1-K)\Gamma_{in}$ that is reflected without passing through the concave portion 3, and a flux $K(1-S)\Gamma_{out}$ that is reflected without reacting with the substance after passing through the concave portion 3. The following expression (16) holds among these fluxes.

$$\Gamma_{in} - (1-K)\Gamma_{in} - K(1-S)\Gamma_{out} = S\Gamma_{out} \quad (16)$$

Therefore, a flux ratio $\Gamma_{out}/\Gamma_{in}$ in Coburn reactive transport model is given by the following expression (17).

$$\frac{\Gamma_{out}}{\Gamma_{in}} = C(x) = \frac{K(x)}{K(x) + S - SK(x)} \quad (17)$$

The expression (17) indicates that the Clausing factor $K(x)$ is replaced with a factor $C(x)$ by replacing Knudsen transport model with Coburn reactive transport model. The relationship between the aspect ratio x and the Clausing factor $K(x)$ is expressed by the above-described expression (3).

Figure 10:
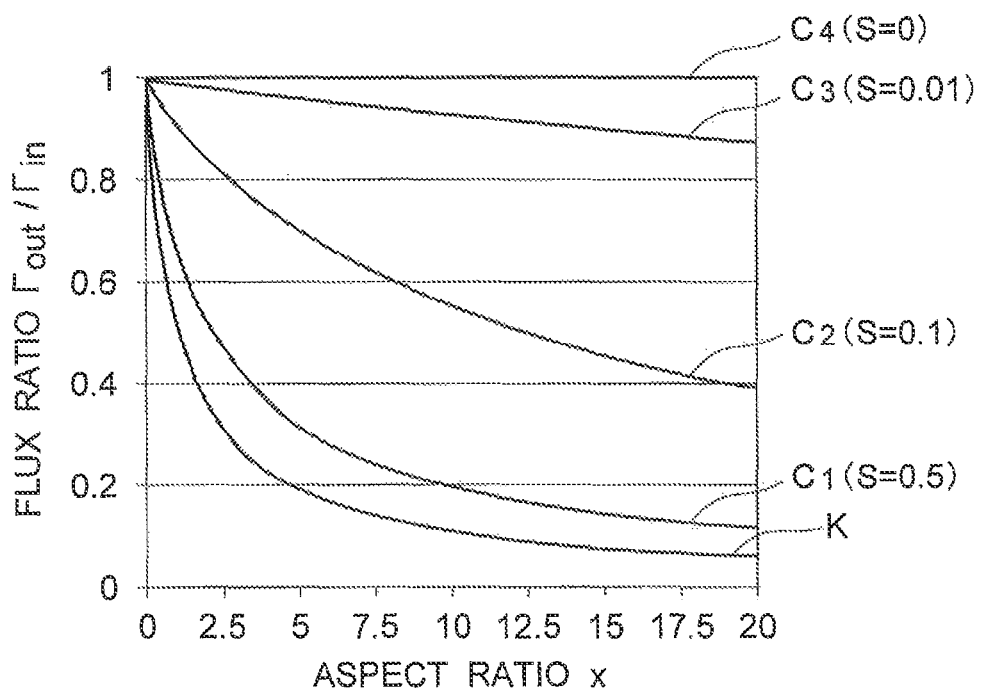
FIG. 10 is a graph for illustrating a relationship between the aspect ratio x and the flux ratio $\Gamma_{out}/\Gamma_{in}$ in FIG. 9.

FIG. 10 is a graph for illustrating a relationship between the aspect ratio x and the flux ratio $\Gamma_{out}/\Gamma_{in}$ in FIG. 9.

A curve K shows the flux ratio $\Gamma_{out}/\Gamma_{in}$ when $S=1$. Curves $C_1$ to $C_4$ show flux ratios $\Gamma_{out}/\Gamma_{in}$ when $S=0.5$, $S=0.1$, $S=0.01$ and $S=0$, respectively. The curve K is the same as the curve in FIG. 5.

(1) Topography Simulation Method of Third Embodiment

The topography simulation method of the present embodiment is performed in the same manner as the topography simulation method of the first embodiment. However, the surface incident fluxes $\Gamma_{out\_1}$ to $\Gamma_{out\_8}$ in the present embodiment are calculated assuming that the flow of the particles in each of the first to eighth layers $L_1$ to $L_8$ can be represented by Coburn reactive transport model of the expression (17).

Therefore, the surface incident flux $\Gamma_{out\_k}$ in a k-th layer $L_k$ of the present embodiment is given by the following expression (18) obtained by replacing $K(x)$ of the expression (15) with $C(x)$.

$$\frac{\Gamma_{out\_k}}{\Gamma_{in}} = C_{out\_k} = \frac{C_{out\_k-1} C_k}{C_{out\_k-1} + C_k - C_{out\_k-1} C_k} \quad (18)$$

$$C_k(x) = \frac{K_k(x)}{K_k(x) + S - SK_k(x)} \quad (19)$$

In this way, the surface incident flux $\Gamma_{out\_k}$ in the k-th layer $L_k$ of the present embodiment is calculated based on the surface incident flux $\Gamma_{out\_k-1}$ ($=C_{out\_k-1}$) in a (k-1)-th layer $L_{k-1}$ adjacent to the k-th layer $L_k$, the transmission probability $K_k$ of the k-th layer $L_k$, and the reaction probability S of the particles.

The surface incident fluxes $\Gamma_{out\_1}$ to $\Gamma_{out\_8}$ calculated in this way are used for calculating the amounts of change $\Delta r_1$ to $\Delta r_8$ of the radii $r_1$ to $r_8$ in step S4.

As described above, the surface incident fluxes $\Gamma_{out\_1}$ to $\Gamma_{out\_8}$ in the present embodiment are calculated using Coburn reactive transport model. Therefore, the present embodiment makes it possible to simulate the topography change of the substance to be processed into various topography with high precision by taking the reaction probability S of the particles into consideration.

First Modification of First to Third Embodiments

In the first embodiment, the surface incident fluxes $\Gamma_{out\_1}$ to $\Gamma_{out\_8}$ are calculated using Knudsen transport model.

Knudsen transport model well fits the behavior of the particles moving isotropically like radicals. Therefore, when the present embodiment is applied to the particles moving anisotropically like ions, it is desirable that the surface incident fluxes $\Gamma_{out\_1}$ to $\Gamma_{out\_8}$ are calculated using a model different from Knudsen transport model.

Figure 11:
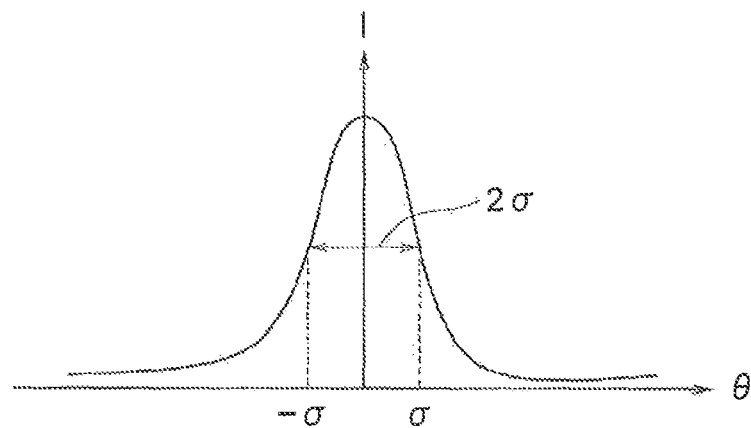
FIG. 11 is a graph showing an example of angle distribution of ions used for processing a semiconductor device.

FIG. 11 is a graph showing an example of angle distribution of the ions used for processing a semiconductor device. The vertical axis in FIG. 11 denotes an ion intensity I. The horizontal axis in FIG. 11 denotes an angle θ. FIG. 11 shows an example that the angle distribution of the ions follows a normal distribution. Reference character σ denotes the standard deviation of the normal distribution. The unit of the angle θ and the standard deviation σ is radian, for example. A width 2σ shown in FIG. 11 corresponds to a half width of the angle distribution of the ions.

Figure 12:
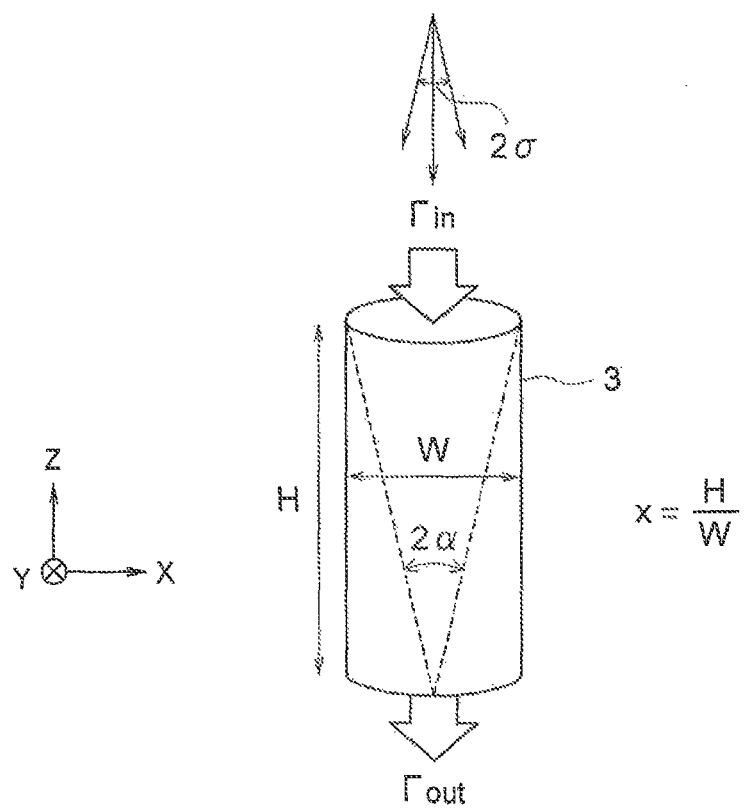
FIG. 12 is a perspective view for illustrating a relationship between the aspect ratio x and the flux ratio $\Gamma_{out}/\Gamma_{in}$ in a case of using the ions.

FIG. 12 is a perspective view for illustrating a relationship between the aspect ratio x and the flux ratio $\Gamma_{out}/\Gamma_{in}$ in the case of using the ions.

FIG. 12 shows an example of the concave portion 3 having a columnar shape, similarly to FIGS. 4 and 9. Reference characters $\Gamma_{in}$ and $\Gamma_{out}$ denote the fluxes of the particles that reach the upper surface and the lower surface of the concave portion 3, respectively. Reference character x denotes the aspect ratio of the concave portion 3. An angle 2α shown in FIG. 12 corresponds to an angular aperture in a case where the aperture is looked up at from the bottom portion of the concave portion 3 having the aspect ratio x.

When the ions are used for processing the semiconductor device, there is a problem with the ratio of the angular aperture 2α to the half width 2σ. In a case where the ratio α/σ is small, since the angular aperture 2α of the concave portion 3 is large relative to the half width 2σ, many ions can reach the bottom surface of the concave portion 3. In contrast, in a case where the ratio α/σ is large, since the angular aperture 2α of the concave portion 3 is small relative to the half width 2σ, many ions cannot reach the bottom surface of the concave portion 3. Therefore, when the ions are used for processing the semiconductor device, the surface incident fluxes $\Gamma_{out\_1}$ to $\Gamma_{out\_8}$ depend on the half width 2σ.

The flux ratio $\Gamma_{out}/\Gamma_{in}$ in FIG. 12 is given by the following expression (20) when the angle distribution of the ions in FIG. 11 is applied:

$$\frac{\Gamma_{out}}{\Gamma_{in}} = \text{erf}\left(\frac{\arctan(1/(2x))}{\sigma\sqrt{2}}\right) \quad (20)$$

where "erf" denotes an error function, "arctan" denotes arctangent, "σ" denotes the standard deviation of the normal distribution, and "x" denotes the aspect ratio.

Figure 13:
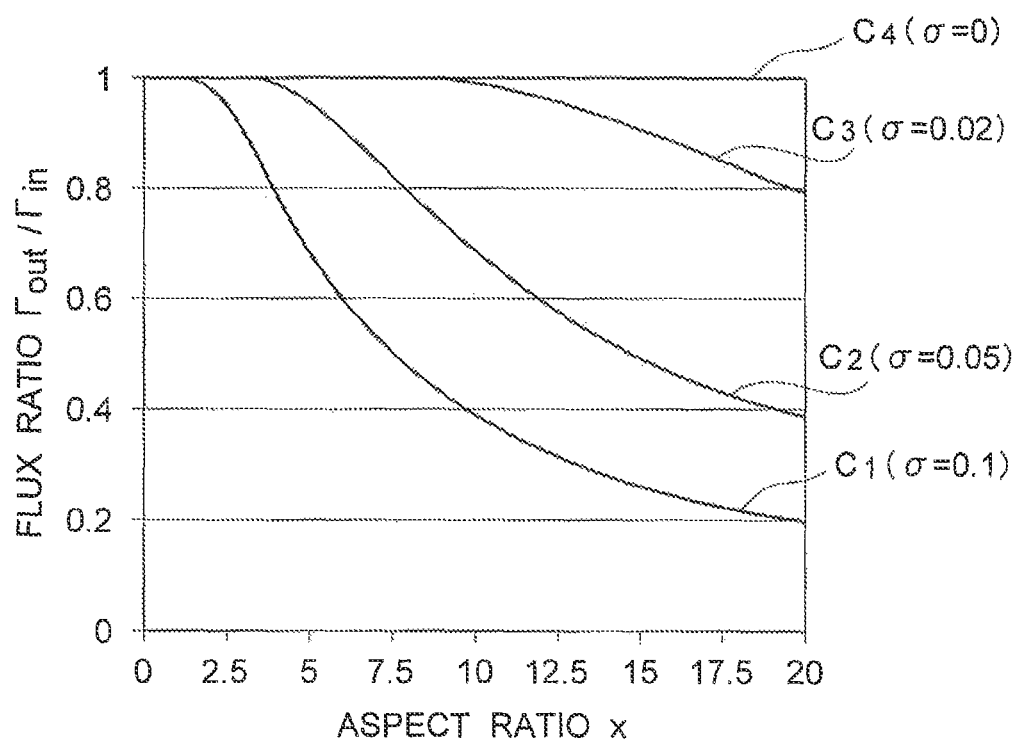
FIG. 13 is a graph for illustrating the relationship between the aspect ratio x and the flux ratio $\Gamma_{out}/\Gamma_{in}$ in the case of using the ions.

FIG. 13 is a graph for illustrating the relationship between the aspect ratio x and the flux ratio $\Gamma_{out}/\Gamma_{in}$ in the case of using the ions.

Curves $C_1$ to $C_4$ denote the flux ratios $\Gamma_{out}/\Gamma_{in}$ when σ=0.1, σ=0.05, σ=0.02 and σ=0, respectively. When comparing FIG. 5 and FIG. 13, the flux ratios $\sigma_{out}/\sigma_{in}$ with the same aspect ratio x are larger in the case of FIG. 5 than in the case of FIG. 13. It is therefore understood that the ions are more likely to reach the bottom surface of the concave portion 3 than the radicals.

The first embodiment can be applied to the particles moving anisotropically like the ions by replacing the function form of the transmission probability $K(x)$ of the expression (3) with a function form shown in FIG. 13. In this case, the transmission probability $K(x)$ is a function of the aspect ratio and the half width 2σ. The half width 2σ is an example of a distribution parameter representing the distribution of the particles.

In addition, the third embodiment can be applied to the particles moving anisotropically like the ions by using the function form shown in FIG. 13.

Second Modification of First to Third Embodiments

Figure 14A:
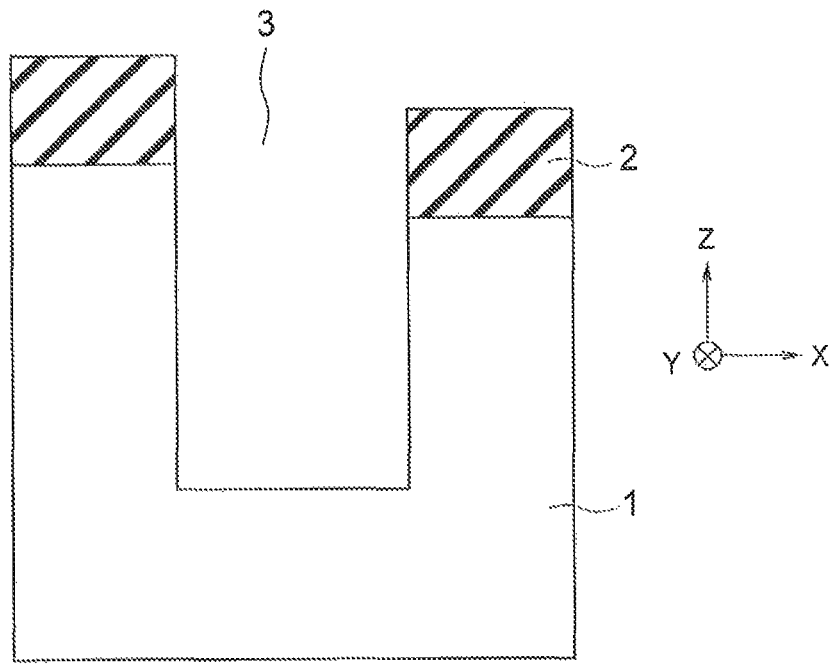
FIGS. 14A and 14B are cross sectional views for illustrating a topography simulation method of a modification of the first to third embodiments.
Figure 14B:
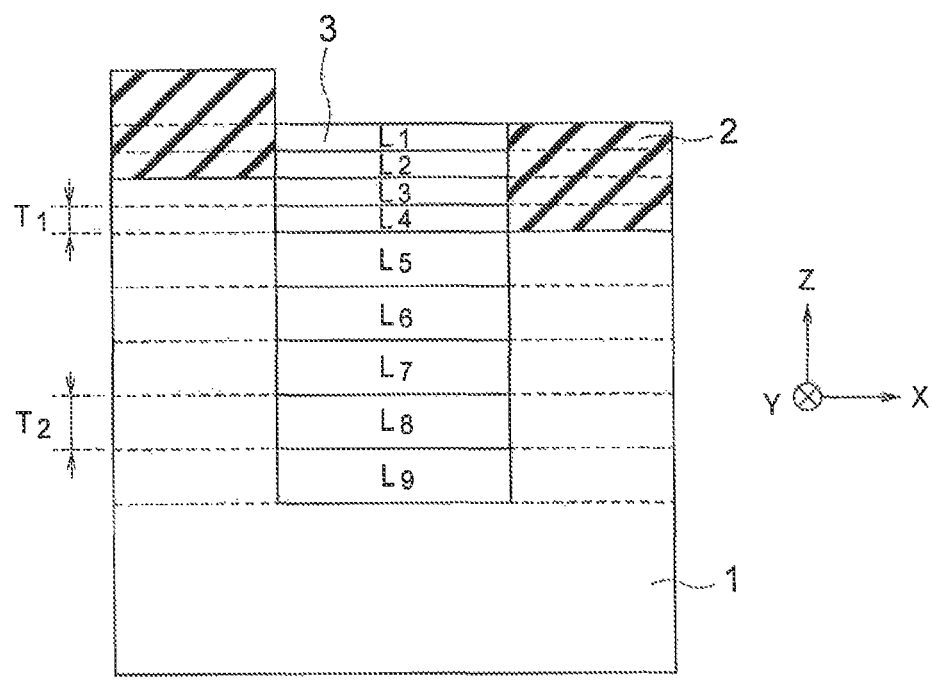

FIGS. 14A and 14B are cross sectional views for illustrating a topography simulation method of a modification of the first to third embodiments.

In FIGS. 2A and 2B, the main surface of the substrate 1 in the initial structure of the substance is set to be a flat plane. In contrast, in FIGS. 14A and 14B, the main surface of the substrate 1 in the initial structure of the substance includes a difference in level. Therefore, the mask layer 2 in FIGS. 14A and 14B includes a first upper surface which is a higher upper surface, and a second upper surface which is a lower upper surface. The first to third embodiments can be also applied to such an initial structure.

When the substance as shown in FIG. 14A is actually processed, the aperture is likely to be closed in the vicinity of the side surface of the mask layer 2. Therefore, when the processing of the topography of such a substance is simulated, it is desirable that a calculation with high precision is performed to the vicinity of the side surface of the mask layer 2. Therefore, in FIG. 14B, a thickness $T_1$ of layers $L_1$ to $L_4$ close to the side surface of the mask layer 2 is set to be small, and a thickness $T_2$ of layers $L_5$ to $L_9$ far from the side surface of the mask layer 2 is set to be large. In the present modification, the start position of dividing the topography of the substance (the upper surface of the first layer $L_1$) is set at the second upper surface (lower upper surface) of the mask layer 2, the end position of dividing the topography of the substance (the lower surface of the ninth layer $L_9$) is set at the bottom surface of the concave portion 3.

When the substance as shown in FIG. 14A is actually processed, the topography change of the concave portion 3 is often affected by forming a deposition layer on the side surface and the mask layer 2 or etching the side surface of the mask layer 2. Therefore, the present modification may handle, as a target of the topography simulation, the topography change of the mask layer 2 as well as the topography change of the substrate 1. In this case, it is desirable to separately set, as a processing rate $R_p$ in the expression (1), the processing rate of the substrate 1 and the processing rate of the mask layer 2.

Fourth Embodiment

Figure 15:
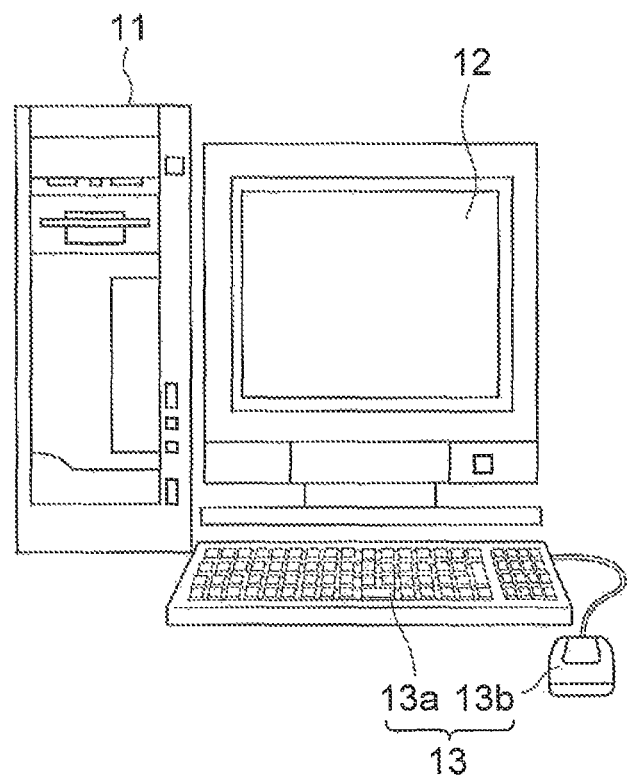
FIG. 15 is an external view showing a configuration of a topography simulation apparatus of a fourth embodiment.

FIG. 15 is an external view showing a configuration of a topography simulation apparatus of a fourth embodiment.

The topography simulation apparatus in FIG. 15 includes a controller 11, a display module 12, and an input module 13.

The controller 11 controls the operation of the topography simulation apparatus. For example, the controller 11 performs one of the topography simulation methods of the first to third embodiments. The controller 11 will be described in detail hereafter.

The display module 12 includes display devices such as a liquid crystal monitor. For example, the display module 12 displays a screen for inputting setting information for the topography simulation, and calculation results of the topography simulation.

The input module 13 includes input devices such as a keyboard 13a and a mouse 13b. For example, the input module 13 is used for inputting the setting information for the topography simulation. Examples of the setting information include information on calculation expressions, information on experimental values or predicted values, information on the structure of the substance, information on the flux of the particles, and instruction information on conditions or procedures of the topography simulation.

Figure 16:
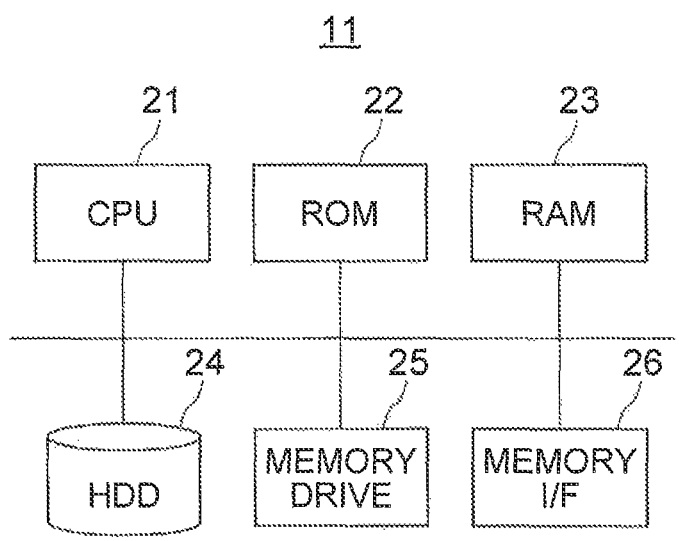
FIG. 16 is a block diagram showing a configuration of a controller in FIG. 15.

FIG. 16 is a block diagram showing a configuration of the controller 11 in FIG. 15.

The controller 11 includes a central processing unit (CPU) 21, a read only memory (ROM) 22, a random access memory (RAM) 23, a hard disk drive (HDD) 24, a memory drive 25 such as a compact disc (CD) drive or digital versatile disk (DVD) drive, and a memory interface (I/F) 26 such as a memory port or a memory slot.

In the present embodiment, a topography simulation program for one of the topography simulation methods of the first to third embodiments is stored in the ROM 22 or the HDD 24. When predetermined instruction information is inputted from the input module 13, the CPU 21 reads the program from the ROM 22 or the HDD 24, expands the read program on the RAM 23, and performs the topography simulation under this program. Various types of data generated with this process are held in the RAM 23.

In the present embodiment, a non-transitory computer readable recording medium in which the topography simulation program is stored may be prepared to install the topography simulation program to the ROM 22 or the HDD 24 from the recording medium. Examples of such a recording medium include CD-ROMs and DVD-ROMs.

In the present embodiment, the topography simulation program may be installed into the ROM 22 or the HDD 24 by downloading it via a network such as the Internet.

As described above, the present embodiment makes it possible to provide the topography simulation apparatus and the topography simulation program for performing the topography simulation methods of the first to third embodiments.

While certain embodiments have been described, these embodiments have been presented by way of example only, and are not intended to limit the scope of the inventions. Indeed, the novel apparatuses, methods and media described herein may be embodied in a variety of other forms; furthermore, various omissions, substitutions and changes in the form of the apparatuses, methods and media described herein may be made without departing from the spirit of the inventions. The accompanying claims and their equivalents are intended to cover such forms or modifications as would fall within the scope and spirit of the inventions.

The invention claimed is:

1. A topography simulation apparatus comprising:
    a division module configured to obtain data representing topography of a substance of a semiconductor device and to divide the topography of the substance in the data into first to n-th layers, where n is an integer of two or more;
    a flux calculation module configured to calculate, for each of the first to n-th layers, a flux of particles which reach a surface of the substance in each layer and contribute to processing of the topography of the substance; and
    a topography calculation module configured to calculate, for each of the first to n-th layers, an amount of change of the topography of the substance in each layer based on the flux,
    wherein the flux calculation module calculates the flux in a k-th layer based on the flux in a (k-1)-th layer adjacent to the k-th layer and a transmission probability of the particles in the k-th layer, where k is an integer from 2 to n.

2. The apparatus of claim 1, wherein the division module divides the topography of the substance which includes a concave portion into the first to n-th layers.

3. The apparatus of claim 2, wherein topography of a region of the concave portion in each layer is a columnar shape, and
the topography calculation module calculates an amount of change of a radius of the concave portion in each layer.

4. The apparatus of claim 1, wherein the transmission probability is a function of a topography parameter representing the topography of the substance in the k-th layer.

5. The apparatus of claim 4, wherein the topography parameter is an aspect ratio of a region of a concave portion of the substance in the k-th layer.

6. The apparatus of claim 1, wherein the transmission probability is a function of a topography parameter representing the topography of the substance in the k-th layer and a distribution parameter representing distribution of the particles.

7. The apparatus of claim 6, wherein the distribution parameter is a half width of the distribution of the particles.

8. The apparatus of claim 1, wherein the division module varies a value of the division number n of the first to n-th layers with a change of the topography of the substance.

9. The apparatus of claim 1, wherein the flux calculation module calculates the flux in the k-th layer based on the flux in the (k-1)-th layer, the transmission probability of the particles in the k-th layer, and a reaction probability of the particles.

10. A topography simulation method performed by an apparatus comprising:
obtaining data representing topography of a substance of a semiconductor device by the apparatus, and dividing the topography of the substance in the data into first to n-th layers by the apparatus, where n is an integer of two or more;
calculating, for each of the first to n-th layers, a flux of particles which reach a surface of the substance in each layer and contribute to processing of the topography of the substance, by the apparatus; and
calculating, for each of the first to n-th layers, an amount of change of the topography of the substance in each layer based on the flux, by the apparatus,
wherein the flux in a k-th layer is calculated based on the flux in a (k-1)-th layer adjacent to the k-th layer and a transmission probability of the particles in the k-th layer, where k is an integer from 2 to n.

11. The method of claim 10, wherein the transmission probability is a function of a topography parameter representing the topography of the substance in the k-th layer.

12. The method of claim 11, wherein the topography parameter is an aspect ratio of a region of a concave portion of the substance in the k-th layer.

13. The method of claim 10, wherein the transmission probability is a function of a topography parameter representing the topography of the substance in the k-th layer and a distribution parameter representing distribution of the particles.

14. The method of claim 13, wherein the distribution parameter is a half width of the distribution of the particles.

15. The method of claim 10, further comprising varying a value of the division number n of the first to n-th layers with a change of the topography of the substance.

16. The method of claim 10, wherein the flux in the k-th layer is calculated based on the flux in the (k-1)-th layer, the transmission probability of the particles in the k-th layer, and a reaction probability of the particles.

17. A non-transitory computer-readable recording medium containing a topography simulation program which causes a computer to perform a topography simulation method, the method comprising:
obtaining data representing topography of a substance of a semiconductor device by the computer, and dividing the topography of the substance in the data into first to n-th layers by the computer, where n is an integer of two or more;
calculating, for each of the first to n-th layers, a flux of particles which reach a surface of the substance in each layer and contribute to processing of the topography of the substance, by the computer; and
calculating, for each of the first to n-th layers, an amount of change of the topography of the substance in each layer based on the flux, by the computer,
wherein the flux in a k-th layer is calculated based on the flux in a (k-1)-th layer adjacent to the k-th layer and a transmission probability of the particles in the k-th layer, where k is an integer from 2 to n.

18. The medium of claim 17, wherein the flux in the k-th layer is calculated based on the flux in the (k-1)-th layer, the transmission probability of the particles in the k-th layer, and a reaction probability of the particles.

* * * * *